(12) United States Patent
Huang et al.

(10) Patent No.: US 12,112,143 B2
(45) Date of Patent: Oct. 8, 2024

(54) MULTIPLICATION AND ACCUMULATION CIRCUIT BASED ON RADIX-4 BOOTH CODE AND DIFFERENTIAL WEIGHT

(71) Applicant: ZHEJIANG UNIVERSITY, Zhejiang (CN)

(72) Inventors: Kejie Huang, Zhejiang (CN); Rui Xiao, Zhejiang (CN); Haibin Shen, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 883 days.

(21) Appl. No.: 17/274,962

(22) PCT Filed: May 26, 2020

(86) PCT No.: PCT/CN2020/092286
§ 371 (c)(1),
(2) Date: Mar. 10, 2021

(87) PCT Pub. No.: WO2020/238889
PCT Pub. Date: Dec. 3, 2020

(65) Prior Publication Data
US 2021/0365241 A1 Nov. 25, 2021

(30) Foreign Application Priority Data
May 30, 2019 (CN) .......................... 201910462374.8

(51) Int. Cl.
*G06F 7/544* (2006.01)
*H03M 3/04* (2006.01)
(Continued)

(52) U.S. Cl.
CPC ............ *G06F 7/5443* (2013.01); *H03M 3/04* (2013.01); *G06N 3/04* (2013.01); *G11C 13/0002* (2013.01)

(58) Field of Classification Search
CPC .......... G06F 7/5443; G06F 2207/4814; H03M 3/04; G06N 3/063; G06N 3/065; G11C 2213/79; G06G 7/14; G06G 7/16
(Continued)

(56) References Cited

U.S. PATENT DOCUMENTS

| 6,571,268 B1* | 5/2003 | Giacalone | ............ G06F 9/3012 |
| | | | 712/E9.032 |
| 8,019,805 B1* | 9/2011 | Sarma | .................... G06F 7/4876 |
| | | | 708/503 |

(Continued)

FOREIGN PATENT DOCUMENTS

| CN | 102662624 | 9/2012 | |
| CN | 107491774 A | * 12/2017 | ........... G06K 9/0002 |

(Continued)

OTHER PUBLICATIONS

Roger Secura, How to use a transistor as a Switch, Nuts and Volts Magazine (Year: 2015).*

(Continued)

*Primary Examiner* — Tan V Mai
(74) *Attorney, Agent, or Firm* — Hodgson Russ LLP

(57) ABSTRACT

The present disclosure provides a multiplication and accumulation circuit based on radix-4 booth code and differential weight storage. The circuit includes an input data encoding circuit, a differential weight storage circuit, an integral calculation circuit and a differential ADC circuit. The input data encoding circuit is configured to encode original input data. The differential weight storage circuit is configured to store weight values, and multiply the original input data after being encoded by the weight values stored to obtain multiplication results. The integral calculation circuit is config- (Continued)

ured to respectively accumulate a positive value and a negative value of each multiplication result. The differential ADC circuit is configured to perform analog-to-digital conversion on a difference between accumulated results of the positive values and the negative values to obtain a digital multiplication and accumulation result.

15 Claims, 6 Drawing Sheets

(51) Int. Cl.
G06N 3/04 (2023.01)
G11C 13/00 (2006.01)

(58) Field of Classification Search
USPC .......................................................... 708/603
See application file for complete search history.

(56) References Cited

U.S. PATENT DOCUMENTS

| | | | |
|---|---|---|---|
| 10,009,014 B1 * | 6/2018 | Hairston | G06F 7/70 |
| 11,501,130 B2 * | 11/2022 | Ma | G06F 7/48 |
| 2019/0156883 A1 * | 5/2019 | Lin | G11C 7/1006 |

FOREIGN PATENT DOCUMENTS

| | | | |
|---|---|---|---|
| CN | 109146070 | 1/2019 | |
| EP | 3370145 A1 * | 9/2018 | G06F 7/523 |
| WO | WO-2005083624 A1 * | 9/2005 | G06J 1/00 |

OTHER PUBLICATIONS

Hing-Mo Lam and Chi-Ying Tsui, A MUX-based High-performance single-cycle CMOS comparator (Year: 2007).*
WIPO, International Search Report for PCT/CN2020/092286, Aug. 27, 2020.

* cited by examiner

MULTIPLICATION AND ACCUMULATION CIRCUIT BASED ON RADIX-4 BOOTH CODE AND DIFFERENTIAL WEIGHT

CROSS-REFERENCE TO RELATED APPLICATIONS

This application is a U.S. national phase application of International Application No. PCT/CN2020/092286, filed on May 26, 2020, which claims priority to Chinese Patent Application No. 201910462374.8, filed on May 30, 2019, the entire content of which is incorporated herein by reference.

TECHNICAL FIELD

The present disclosure relates to a resistive random-access-memory (RRAM) circuit, and more particularly, to a multiplication and accumulation circuit based on radix-4 booth code and differential weight, which is applicable in core calculation circuit arrays of neuromorphic chips and belongs to a field of neuromorphic circuits.

BACKGROUND

In recent years, artificial intelligence technologies have developed rapidly, and various algorithms and applications are in high-speed iterations, which requires higher storage capacities, computing power and energy efficiency for hardwares. Conventional computers use VonNeumann structure, in which storage units and computing units are separated. When processing data, the data is firstly read from the storage units and then input into the computing unit for calculation. However, the storage units adopt a hierarchical structure of SRAM-DRAM-FLASH, thus communication between the storage units and the computing units suffers low communication rate and high power consumption, which greatly limits efficiency of neural network.

SUMMARY

In the present disclosure, a multiplication and accumulation circuit based on radix-4 booth code and differential weight storage includes an input data encoding circuit, a differential weight storage circuit, an integral calculation circuit and a differential digital-to-analog converters (ADC) circuit, Output of the encoding circuit is send into the differential ADC circuit after sequentially passing through the differential weight storage circuit and the integral calculation circuit. The input data encoding circuit is configured to encode original input data. The differential weight storage circuit is configured to store weight values, and multiply the original input data after being encoded by the weight values stored to obtain multiplication results. The integral calculation circuit is configured to respectively accumulate a positive value and a negative value of each multiplication result. The differential ADC circuit is configured to perform analog-to-digital conversion on a difference between accumulated results of the positive values and the negative values to obtain a digital multiplication and accumulation result.

BRIEF DESCRIPTION OF THE DRAWINGS

These and/or other aspects and advantages of embodiments of the present disclosure will become apparent and more readily appreciated from the following descriptions made with reference to the accompanying drawings, in which:

FIG. 7($a$) is a positive integral circuit, and FIG. 7($b$) is a negative integral circuit.

DETAILED DESCRIPTION

Figure 1:
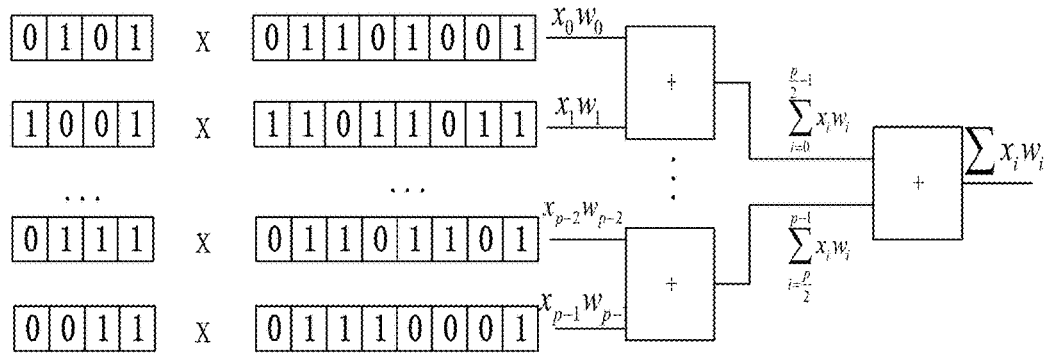
FIG. 1 is a structure diagram of a conventional multiplication and accumulation circuit.

The present disclosure will be further described in detail below with reference to the drawings and specific embodiments.

Neuromorphic computing integrates the storage units and the computing units by imitating structures of human brains, which solves the problem of the VonNeumann structure mentioned above, and greatly improves computing efficiency of artificial neural network. A new RRAM is adopted to convert a weighted combination of input signals into an output voltage, thus a basic operation, i.e., multiplication-andaccumulation (MAC) operation, in the artificial neural network is completed to achieve in-memory parallel computing with ultra-low power consumption.

Related multipliers usually adopt binary coding and a shift addition manner to implement multiplication operation. This calculation method produces a large number of partial products and requires a plurality of shift operations, thus a large number of shifting registers are adopted for storage, and finally the partial products are added by adders. This kind of multiplier has large size and high power consumption, and could only achieve one multiplication operation at each time. Therefore, computing efficiency is low, and the computing efficiency of the neural network is greatly limited. The present disclosure adopts radix-4 booth code to encode input data, which reduces bit width of the input data by half, and provides a new and efficient combination of multiplication and integration operations in memory. Therefore, large-scale parallel computing is realized, power consumption of multiplication and accumulation operations is significantly reduced, and computing performance of neural network processors is improved.

Distribution of weight values in the neural network follows normal distribution law, and the proportion of "1" accounts for about ⅓. Weights in current neuromorphic processors are mostly stored in a form of complements. If stored in the form of complements, the proportion of "1" in the weights rise to ½, and computing power consumption increases correspondingly. Therefore, the present disclosure provides a multiplication and accumulation array with differential weight storage to store the weights as positive and negative value differentials, which greatly reduces the proportion of "1" in the weights, thereby reducing power consumption of the neural network circuit during computing.

Input ends of neuromorphic computing circuits currently proposed mostly take high-precision digital-to-analog converters (DACs) as interface devices. Energy consumption of the interface devices accounts for more than 80% of overall energy consumption, which is not conducive for applications in edge computing devices. Moreover, the current neuromorphic computing solutions achieve low weight quantization accuracy and activation value quantization accuracy. The solutions are merely for simple networks such as Lenet, and cause obviously performance losses for large-scale deep neural networks such as Alexnet. Application scope of the solutions is limited greatly.

In view of the above problem that multipliers have large area overhead, high power consumption, low computing efficiency and difficulty in achieving large-scale parallel computing, the present disclosure provides a multiplication and accumulation circuit based on radix-4 coding and differential weight and a multiplication and accumulation thereof. The circuit is applicable for multiplication and accumulation operations of neuromorphic computing cores in the neuromorphic chips, thereby realizing large-scale parallel computing merely through hardwares with low power consumption. The circuit may be applicable in high-precision and high-performance deep neural networks.

The structure diagram of a related multiplication and accumulation circuit is illustrated in FIG. 1. A single multiplier could process one row of data at each time, and a result calculated by the multiplier is input into an adder to complete the multiplication and accumulation operation. Assuming that there are n inputs and n outputs for multiplication, it may take n multipliers and n-1 two-input adders to get a final result. The scale of the whole circuit is large, and power consumption is also large.

Analog-to-digital converters are added at input ends of some circuits, and digital-to-analog converters are added at output ends, thus the circuits have large area and high power consumption. However, a RRAM is used as a basic unit to implement a differential weight storage circuit in the present disclosure. Multiplication of input data and a weight value is realized when current passes through the basic unit. The multiplication process is achieved without multipliers, which is not like a conventional multiplication and accumulation circuit. Data output from the output ends of the basic units in each column is integrated through an integral sub-circuit, so as to realize the accumulation process without adders, which is not like the conventional circuit. The circuit and computing method of the present disclosure realize large-scale parallel computing, and energy consumption of the overall circuit is very low, and a high-precision and high-performance deep neural network is realized with low energy consumption.

The technical solution of the present disclosure is provided as follows.

Figure 2:
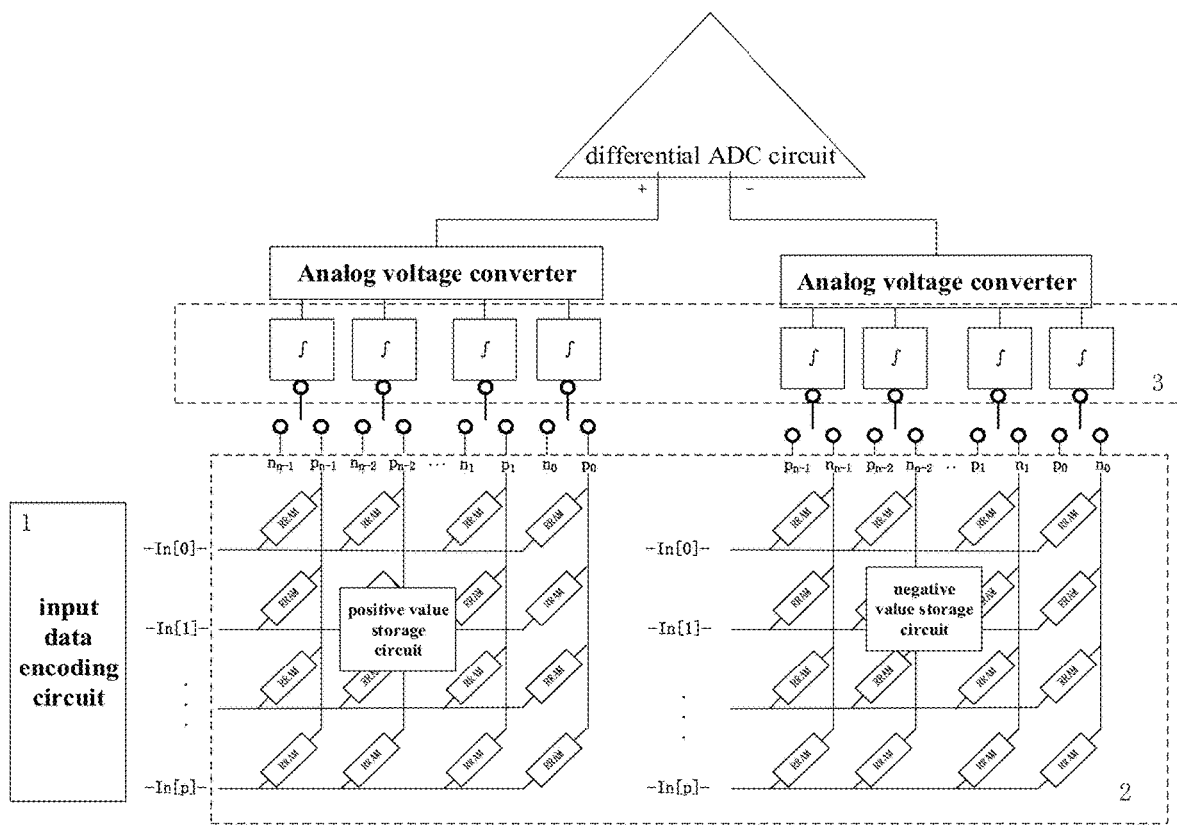
FIG. 2 is a structure diagram of a multiplication and accumulation circuit based on radix-4 booth code and differential weight storage according to the present disclosure, in which: 1. input data encoding circuit, 2. differential weight storage circuit, 3. integral calculation circuit.

As illustrated in FIG. 2, an input data encoding circuit, a differential weight storage circuit, an integral calculation circuit and a differential ADC circuit are included in a specific implement. The output of the input data encoding circuit is send into the differential ADC circuit after sequentially passing through the differential weight storage circuit and the integral calculation circuit, and the differential ADC circuit converts an analog result to a digital multiplication and accumulation result. Original input data after being encoded by the input data encoding circuit is multiplied by weight values stored in the differential weight storage circuit to obtain multiplication results. A positive value and a negative value of each multiplication result are respectively accumulated through the integral calculation circuit, to obtain an equivalent analog voltage value corresponding to an input bit of the original input data currently processed. Analog-to-digital conversion is performed by the differential ADC circuit on a difference between accumulated results of the positive values and the negative values to achieve weighting between different input bits, and then a final multiplication and accumulation result is obtained, thereby realizing the processing of the multiplication and accumulation circuit.

Figure 3:
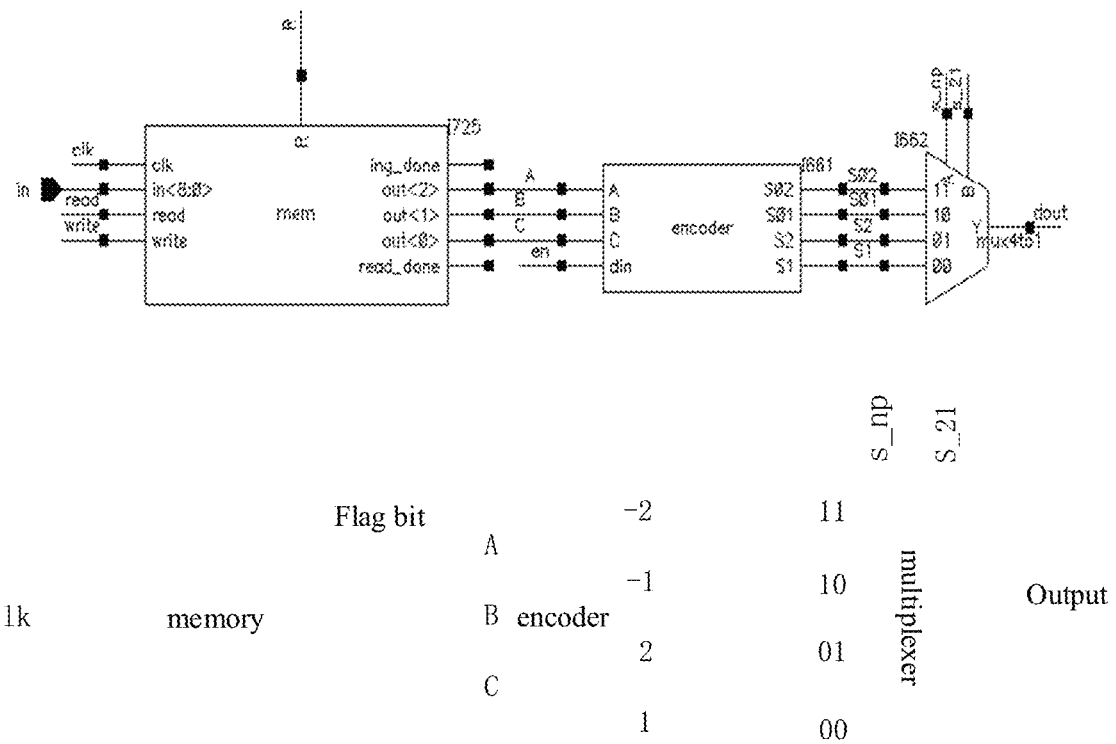
FIG. 3 is the input data encoding circuit according to the present disclosure.

As illustrated in FIG. 3, the input data encoding circuit includes a memory, an encoder and a multiplexer (mux) coupled in sequence. The input data is pre-stored in the memory and input to the encoder according to a timing sequence for encoding, and then sequentially select four different output channels through the mux to output different encoding results in sequence.

In detail, the original input data is binary code data stored in the memory in advance, the data pre-stored in the memory is output according to the timing sequence, three lowest bits of current data are output into the encoder each time, the encoder receives the three lowest bits of data (i.e., three-bits binary number) from the memory and encodes the three lowest bits of data into radix-4 booth code. An encoding result is gated to the differential weight storage circuit through a mux 4 to 1 to output encoded values in sequence within 4 clock cycles, and each encoded value of the radix-4 booth code is output every clock cycle, and four different encoded values of the radix-4 booth code are output within 4 clock cycles, which are 1, −1, 2, and −2, respectively.

The differential weight storage circuit uses a non-volatile RRAM as a storage unit. Compared to conventional SRAM unit, power consumption is only generated during the computing process.

Figure 5:
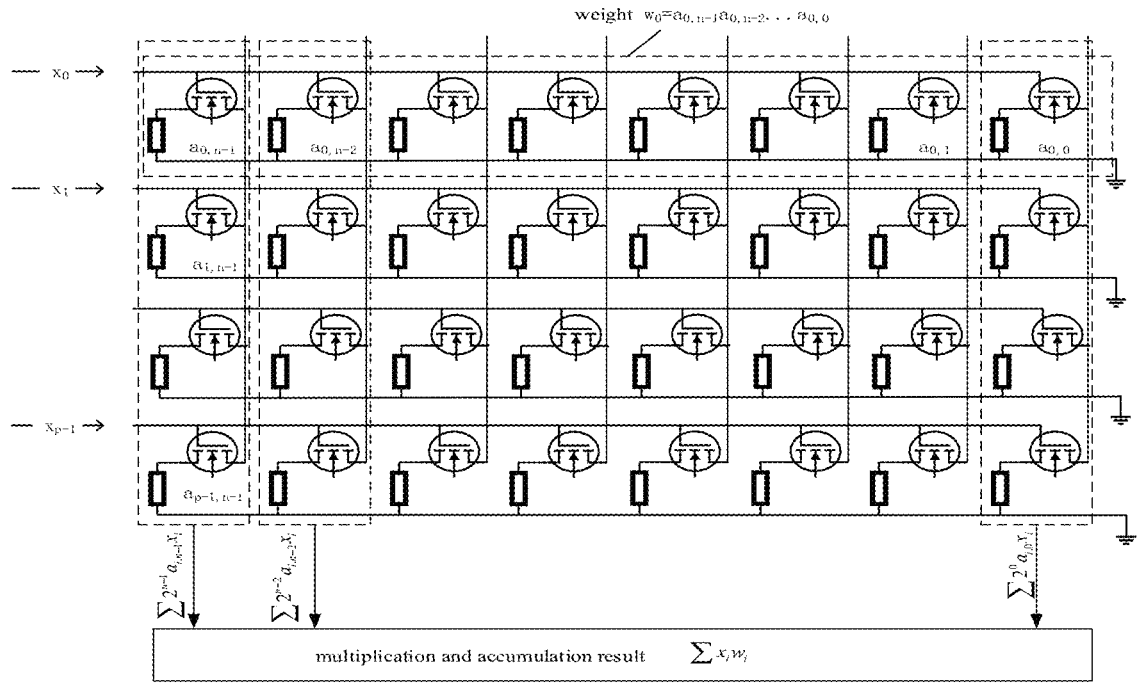
FIG. 5 is the differential weight storage circuit according to the present disclosure.
Figure 6:
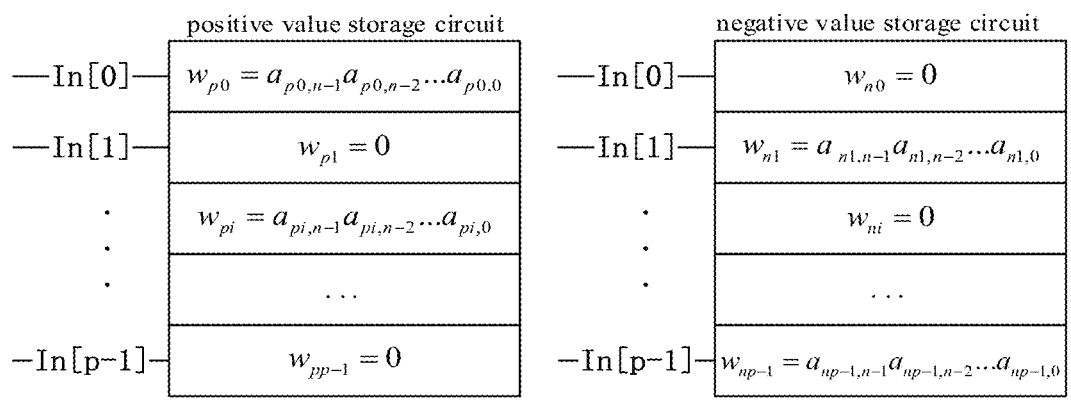
FIG. 6 is a block diagram of weight storage logic according to the present disclosure.

As illustrated in FIG. 5, the differential weight storage circuit includes two weight storage circuits with equal size, each of the weight storage circuits is composed of arrays of a plurality of basic units, each of the basic units is composed of a Metal-Oxide-Semiconductor Field-Effect Transistor (simplify as transistor) and a binary RRAM coupled to each other, the basic units in the same column are coupled in series, and the basic units in the same row are coupled in series. As illustrated in FIG. 6, each basic unit of the weight storage circuit stores one bit of weight, the basic units in each row of the weight storage circuit store one weight value together. The two weight storage circuits include a positive value storage circuit and a negative value storage circuit, the positive value storage circuit stores positive weight values, and the negative value storage circuit stores negative weight values.

In specific implementation, in the same row of the two weight storage circuits, one is a positive/negative weight value, and the other is zero.

Difference between a value stored in a row of one weight storage circuit and a value stored in the same row of the other weight storage circuit is obtained to generate a weight value. When the weight value is positive, the weight value is stored in the positive value storage circuit, and the negative value storage circuit is set to zero. When the weight value is negative, the weight value is stored in the negative value storage circuit, and the positive value storage circuit is set to zero.

Starting from the three lowest bits of the original input data, every three bits are sequentially input to the input data encoding circuit, and every three bits of data having one bit overlapped. After processing by the input data encoding circuit, encoded data values are transferred by a mux to the basic units $a_{1,n-1}$ in each row, the basic units in each row receive the same encoded value from the input data encoding circuit. The basic units in different rows receive different encoded values from the input data encoding circuit. The basic units in each row receive the encoded value, and multiplies the received values by each weight in the positive value storage circuit/negative value storage circuit to obtain multiplication results. The multiplication results are added by column to obtain the multiplication and accumulation result of the current bit.

Starting from the lowest bit of the original input data, after the calculation of one bit of the original input data is completed, the original input data is moved to the next bit to continue the input calculation.

Figure 4:
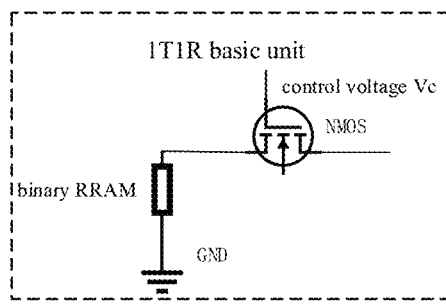
FIG. 4 is a structural diagram of a 1T1R memory used in a specific implementation of the present disclosure.

As illustrated in FIG. 4, in specific implementations, each of the basic units is composed of a transistor and a binary RRAM coupled in series. One end of the binary RRAM is coupled to a source of the transistor, and the other end of the binary RRAM is grounded. A gate of the transistor is coupled to the output end (i.e., a mux) of the input data encoding circuit, and a drain of the transistor is configured as an output end of the basic unit and coupled to an input end of the integral calculation circuit. The drains of the transistors of the basic units in the same column are coupled in series, and the gates of the transistors of the basic units in the same row are coupled in series and configured as an input end of the basic unit.

In specific implementation, an one-transistor-one RRAM (1T1R) structure is used as a basic component unit. The transistor performs as a switch. And 8 1-bit RRAMs simulate binary units of the weights in the form of fixed points. The present disclosure models a RRAM based on experimental data of nitrogen-doped aluminum oxide structure. Each RRAM has two resistance states: a low resistance state (about 10MΩ) and a high resistance state (about 10G-100GΩ). The RRAM array is turned on only during the integration phase and is turned off most time according to the timing sequence, thereby greatly reducing power consumption of synapse arrays. The input signal from the input circuit is directly used as a control voltage Vc of the 1T1R unit in the RRAM array, thus DAC is ignored in the input end, which greatly reduces the energy consumption and area occupation.

Simply, the present disclosure changes the conventional computing method of accumulating after multiplying by row into the method of accumulating after multiplying by column, to realize large-scale parallel computing.

The number of the basic units in the positive value storage circuit and the negative value storage circuit are the same, and the number of rows and columns are the same. The positive and negative store circuits have same number of basic units, same rows and same columns.

Figure 9:
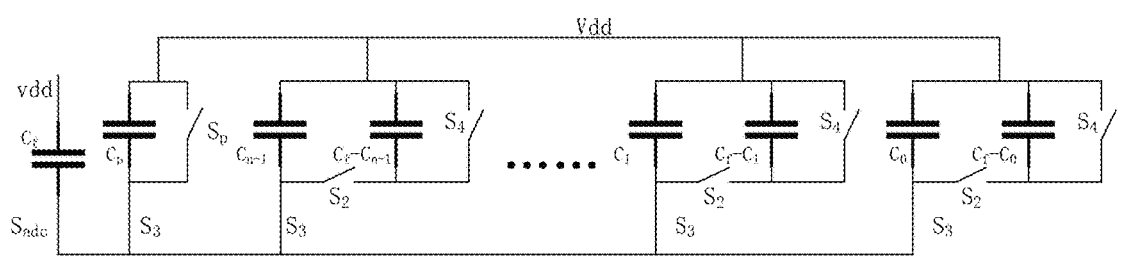
FIG. 9 is a structural diagram of an analog voltage conversion circuit according to the present disclosure.

As illustrated in FIGS. 7 and 9, the integral calculation circuit includes a series of integral sub-circuits and a compensation circuit.

Each integral sub-circuit includes a selection switch group and an integrator, each selection switch group is composed of three transistors including two selection transistors $Q_{1,n-1}$, $Q_{2,n-1}$ and a control transistor $S_{1,n-1}$. Sources of the two selection transistors are configured as the input ends of the integral calculation circuit, and are respectively coupled to output ends of the basic units in one column of the positive value storage circuit and the negative value storage circuit. That is, the source of the selection transistor is coupled to the output ends of the basic units in the same column of the positive value storage circuit, and the source of the other selection transistor is coupled to the output ends of the basic units in the same column of the negative value storage circuit. The drains of the two selection transistors are coupled to the source of the control transistor. The gate of the control transistor is coupled to an external control switch circuit, and the drain of the control transistor is configured as the output end of the integral calculation circuit and coupled to the differential ADC circuit.

Each integrator includes a first integration capacitor $C_{n-1}$, a second integration capacitor $(C_f$-$C_{n-1})$, a reset switch $S_4$, and an integration operation switch $S_2$. The first integration capacitor $C_{n-1}$, the second integration capacitor $(C_f$-$C_{n-1})$, the reset switch $S_4$ are coupled in parallel between a voltage Vdd and an output end of the integral sub-circuits. The integration operation switch $S_2$ is coupled in series between the first integration capacitor $C_{n-1}$ and the second integration capacitor $(C_f$-$C_{n-1})$. A lead-out between the first integration capacitor $C_{n-1}$ and the integration operation switch $S_2$ is coupled to an ADC sampling line by a charge redistribution switch $S_3$.

The compensation circuit includes a compensation capacitor $C_p$ and a compensation capacitor reset switch $S_p$. The compensation capacitor $C_p$ and the compensation capacitor reset switch $S_p$ are coupled in parallel between the voltage end Vdd and the ADC sampling line As illustrated in FIG. 9, the differential ADC circuit includes a charge redistribution switch $S_3$ arranged on the ADC sampling line, an ADC sampling capacitor $C_f$ and an ADC sampling switch Sadc. The charge redistribution switch $S_3$ is arranged between the compensation capacitor $C_p$ and the compensation capacitor reset switch $S_p$ coupled in parallel and the ADC sampling line. The charge redistribution switch $S_3$ is arranged between the ADC sampling line and the lead-out between each first integration capacitor $C_{n-1}$ and each integration operation switch $S_2$. The ADC sampling capacitor $C_f$ and the ADC sampling switch Sadc coupled in series are coupled between the voltage end Vdd and the output end of the integral sub-circuit.

The number of the charge redistribution switch $S_3$ is same as that of the column of the basic units in positive/negative storage circuit. Each of the integral sub-circuits is correspondingly coupled to the basic units in one column of the positive value storage circuit and the negative value storage circuit each. Different integral sub-circuits are correspondingly coupled to the basic units in different columns of the positive value storage circuit and the negative value storage circuit each.

Figure 7A:
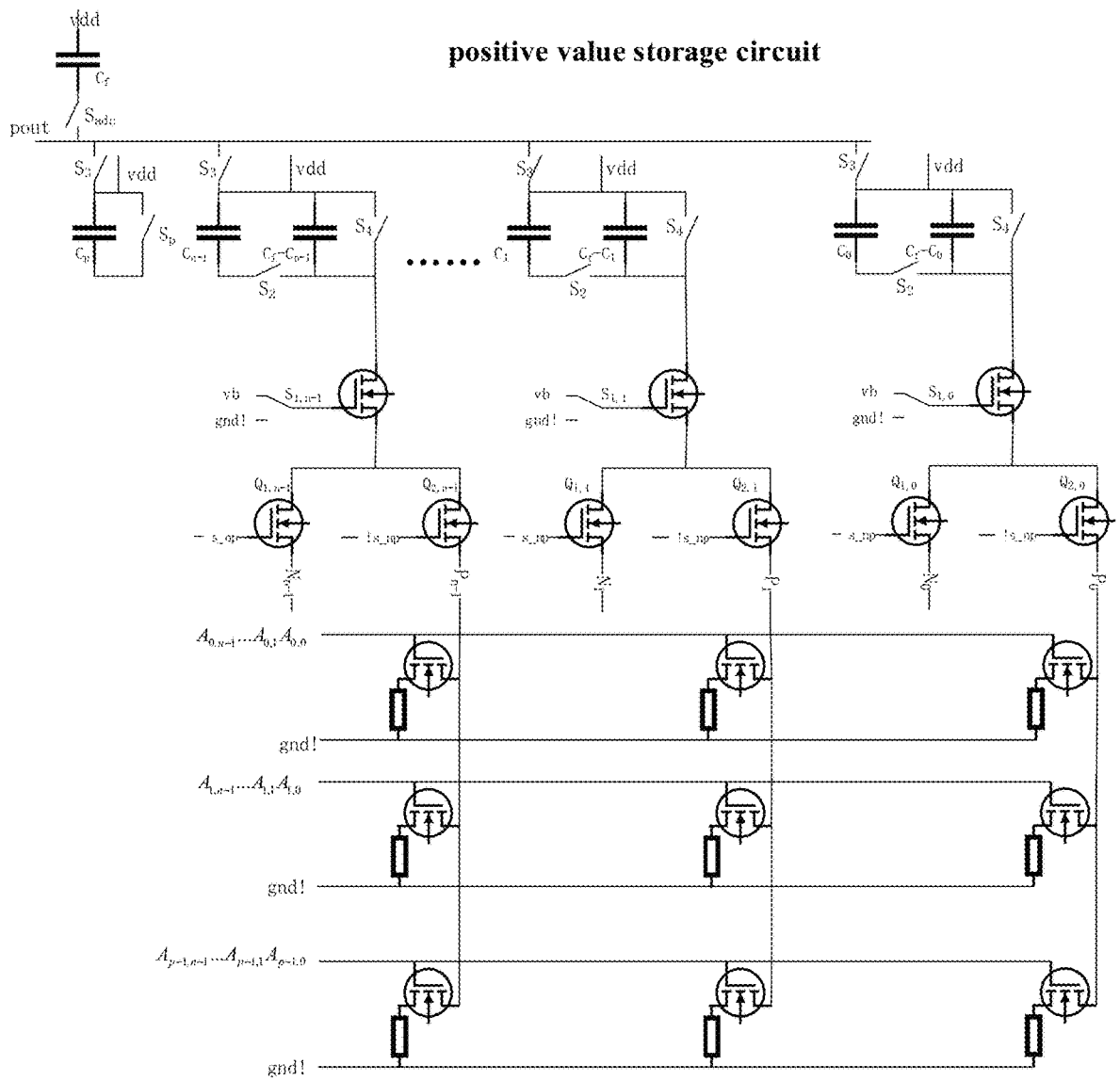
FIG. 7 is a structural diagram of the integral calculation circuit according to the present disclosure.
Figure 7B:
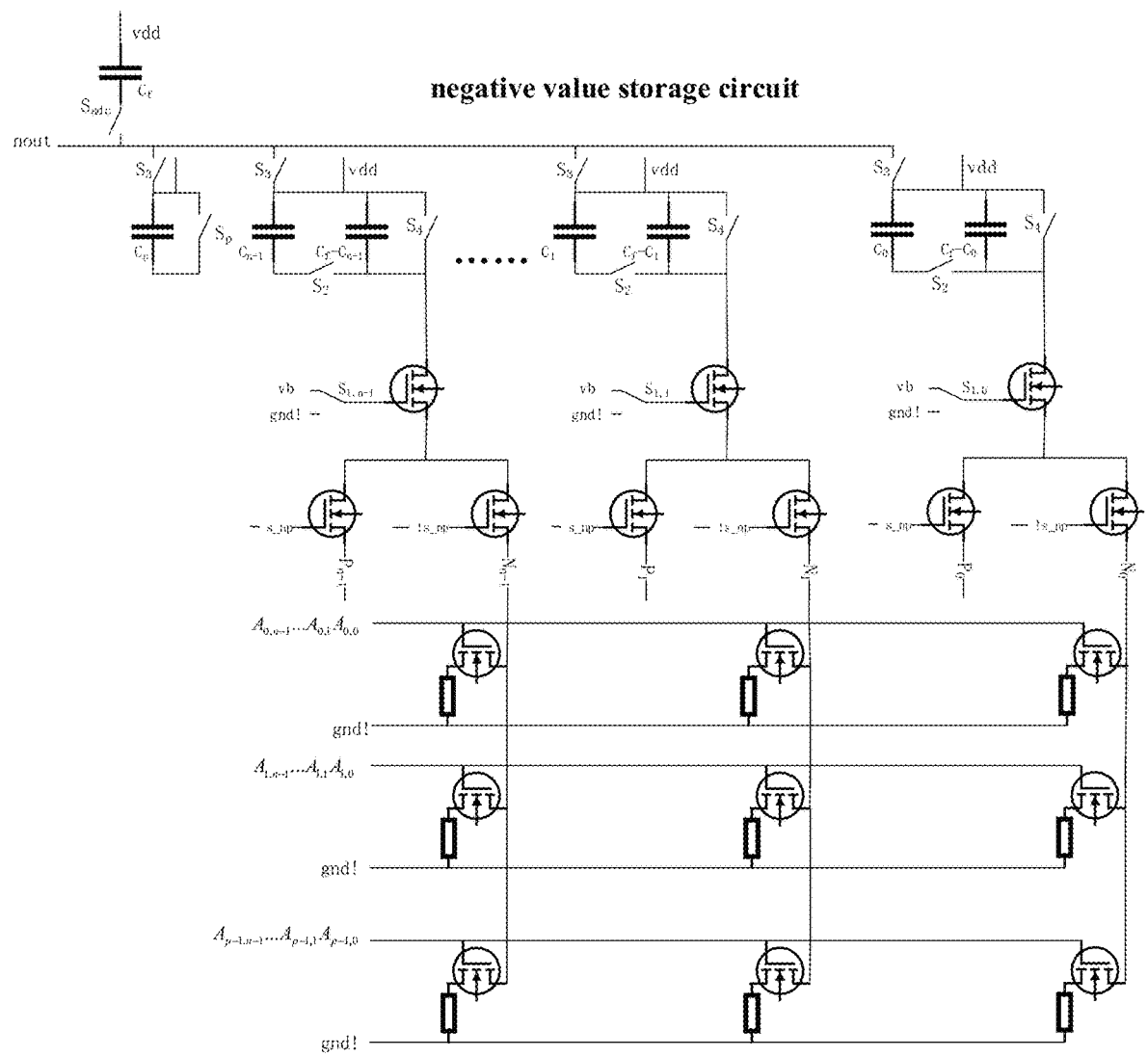

The integral circuits are divided into a positive value integral circuit and a negative value integral circuit. The positive value integral circuit integrates positives, and the negative value integral circuit integrates negatives. The positive value storage circuit and its corresponding integral calculation circuit and the differential ADC circuit form the positive value integral circuit, as shown in FIG. 7(a). The negative value storage circuit and its corresponding integral calculation circuit and the differential ADC circuit form the negative value integral circuit, as shown in FIG. 7(b).

Figure 8:
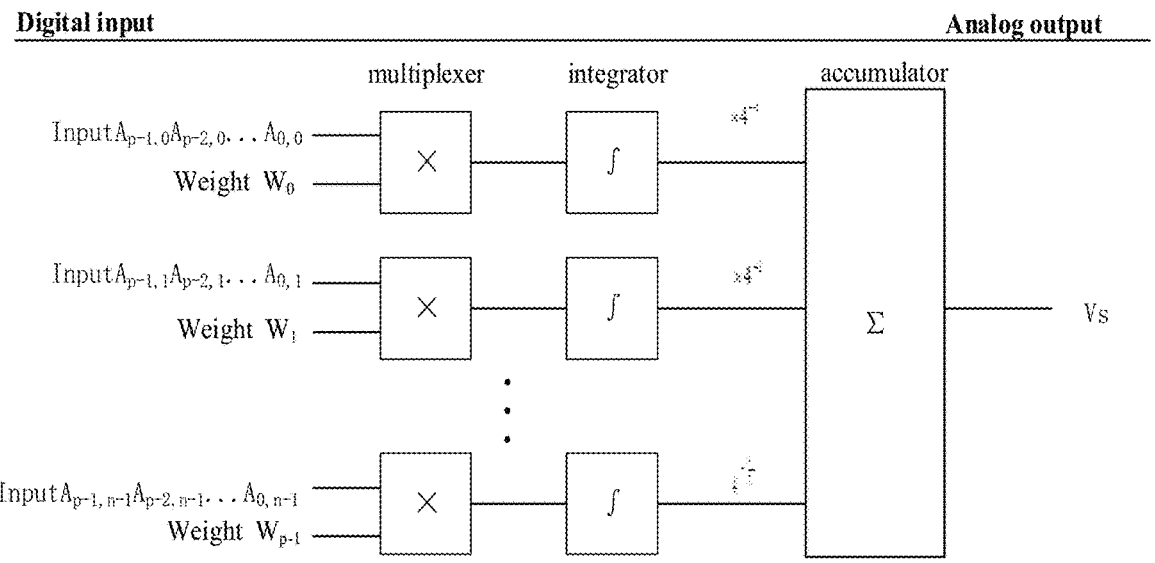
FIG. 8 is a block diagram of an integral calculation process according to the present disclosure.

In the present disclosure, 8-bits input signal is coded into a 4-bits radix-4 booth code. The bits are input into the integral circuit, the axons first computing and the charge redistribution strategy are used to achieve parallel computing. The integral computing process is shown in FIG. 8. The input signal is expressed in a digital form x=An/2−1 An/2−. . . . A0. For each bit of a binary number $A_i$ (i=n/2−1, n/2−2, . . . , 0) of the input signal, the input lines with coding values of 1,−1, 2, and −2 are sequentially gated under control of a time multiplexing circuit. The weight value is expressed in the digital form w=$a_{n-1}a_{n-2}$. . . $a_0$, w=$a_{n-1}a_{n-2}$. . . $a_0$. The results of multiplying the input signal by the weight values may be obtained and expressed as a current signal. Meanwhile, the current signal is transmitted to the positive integral circuit or the negative integral circuit respectively for integral calculation to complete a multiplication and accumulation process of the input data.

The analog voltage converter circuit provided in this disclosure is shown in FIG. 9. After obtaining one result of multiplication and accumulation of the input data through the integral calculation circuit, the analog-to-digital conversion circuit performs charge distribution through timing control after inputting 1, −1, and performs charge distribution again after inputting 2, −2. Thus, a weighting process between different input bits is completed, and positive and negative analog output voltages are obtained. These two analog output voltages are input into positive and negative input ends of a differential successive approximation register analog-to-digital converter (SAR ADC) respectively, to obtain a digital multiplication and accumulation output and to further form a completed neuromorphic calculation circuit.

The present disclosure uses the plurality of integrators to perform integral operation on the multiplication results. Based on the special radix-4 booth code, the code values 1/1 and 2/−2 have different contribution. The capacitors of different integrators have a two-fold relationship. All integrators are coupled in parallel and through the charge redistribution, a multiplication and accumulation result after 1-bit input is obtained.

The code value and the weight value both have positive and negative. Signal input is controlled by switches, the positive integral circuit only integrates the positives, and the negative integral circuit only integrates the negatives. After the 1-bit integrated data is completed, through the analog voltage conversion operation, the compensation capacitor reset switch $S_p$ is closed twice when the 1/1 and 2/−2 of the adix-4 code are input respectively, and charge redistribution operation is performed twice, namely a current value*1/4. Therefore, weighting operation between different input data bits is realized.

After all data input is completed, the difference between the analog output voltages obtained by the positive and negative integration circuits is the final multiplication and accumulation result.

The embodiments of the present disclosure and its implementation process are as follows.

FIG. 3 illustrates an input data encoding circuit. The input data encoding circuit includes a memory (mem), an encoder and a multiplexer (mux4to1) coupled in sequence. A clock port (clk) of the mem is coupled to a clock signal, an input port (in) is configured to input the original input data, and a flag bit (ing_done) is configured to indicate completion of outputting the original input data. The three output ports are respectively coupled with input ports A, B and C of the encoder, and four output ports S02, S01, S2, and S1 (i.e., −2, −1, 2, 1) of the encoder are respectively coupled to four input ports 11, 10, 01 and 00. The two control signals of the mux are control signal 1 (s_np) and control signal 2 (s_21).

The mem is configured to store the original input data. At a rising edge of each clock, the mem reads the original input data internally for output. Assuming that the original input data is a six-digits binary number 011010, the output process is as follows.

Initially, the flag bit is 0. From the first clock to the fourth clock, the output from top to bottom are the next lowest bit 1 and the lowest bit 0 of the original input data and a single 0, and then the original input data is logically shifted one bit to the right to become 001101. From the fifth clock to the eighth clock, the output from top to bottom are the low three bits 1, 0, 1 of the original input data, and then the original input data is logically shifted by two bits to the right to become 000011. From the ninth clock to the twelfth clock, the output from top to bottom is the low three bits 0, 1, 1 of the original input data, and then the original data is logically shifted by two bits to the right to become 000000. At the thirteenth clock, the original data are all 0, the output ends, the flag bit is changed from 0 to 1.

The encoder receives a three-bits input signal from the mem and encodes the input signal based on the radix-4 booth code. The encoding rule is multiplying an input value A by −2 and adding an input value B and an input value C to obtain a result value. Assuming the result value is −2, then the output end −2 is high level, and other output ends each is low level. If the result is −1, then the output end −1 is high level, and other output ends are low level. Assuming the result value is 2, then the output end 2 is high level, and other output ends are low level. If the result is 1, then the output end 1 is high level, and other output ends are low level. Assuming that the result value is 0, then all output ends are low level. Still assuming that the original input data is 011010, according to the output of the mem, from the first clock to the fourth clock, the output end −2 is high level, and other output ends are low level. From the fifth clock to the eighth clock, the output end −1 is high level, and other output ends are low level. From the ninth clock to the twelfth clock, the output end 2 is high level, and other output ends are low level. At the thirteenth clock, all output ends are low level.

The output of the encoder is input the mux and the mux are gated by the control signal 1 (s_np) and the control signal 2 (s_21). When the control signal 1 (s_np) is high level, the 11 or 10 end is gated, and when the control signal 1 (s_np) is low level, the 01 or 00 end is gated. When the control signal 2 (s_21) is high level, the 11 or 01 end is gated, and when the control signal 2 (s_21) is low level, the 10 or 00 end is gated. By changing the timing of the control signal 1 (s_np) and the control signal 2 (s_21), ends 00, 10, 01 and 11 are sequentially gated, so as to control the output of the input data encoding circuit in four clock cycles is 1, −1, 2, −2 in a radix-4 booth code form. Still assuming that the original input data is 011010, from the first clock cycle to the fourth clock cycle of the encoder, an output end of the encoder −2 is 1, and the end is gated in the fourth clock cycle, so that from the first clock cycle to the third clock cycle, the output of the input data encoding circuit is 0, and the output of the input data encoding circuit is 1 in the fourth clock cycle. Same as the first four clock cycles, from the fifth clock cycle to the eighth clock cycle, the output of the input data encoding circuit in the sixth clock cycle is 1, and the output of the input data encoding circuit in other clock cycles is 0. From the ninth clock cycle to the twelfth clock cycle, the output of the input data encoding circuit in the ninth clock cycle is 1, and the output of the input data encoding circuit in other clock cycles is 0.

FIG. 5 provides a differential weight storage circuit, i.e., the positive value storage circuit and the negative value storage circuit, the scale and structure of the two circuits are the same, and the two circuits are used to store positive and negative weight values, respectively. In this storage array, 8 basic units are used to store a binary weight, so an 8-bits fixed point weight is expressed as $w=a_{n-1}a_{n-2}\ldots a_0$, $a_{n-1}$ is a binary bit of the weight value and expressed by the basic unit shown in FIG. 4. When the basic unit is in the high resistance state, the resistance value is 100G, which is expressed as $a_{n-1}=0$. When the basic unit is in the low resistance state, the resistance value is 10M, which is expressed as $a_{n-1}=1$.

The weight storage mechanism adopted in the present disclosure is shown in FIG. 6. If a certain weight wx is positive, the binary sequence of its value wx is stored in a row of the positive value storage array, and the storage value in the corresponding row of the negative value storage circuit is 0. Similarly, if a certain weight wy is negative, a binary sequence of its absolute value |wy| is stored in a row of the negative value storage array, and the storage value in the corresponding row of the positive value storage array is 0. It should be noted that when the weight value is negative, its negative value, that is, the absolute value, is stored, so that all sign bits are guaranteed to be 0 and the subsequent calculation process is simplified.

The weight storage mechanism adopted in the present disclosure is shown in FIG. 6. The differential weight circuit is divided into the positive value storage circuit and the negative value storage circuit. The difference between the data stored in a row of one circuit and the data stored in the same row of the other circuit is a current weight value, and it is ensured that at least one circuit has a storage value of 0 in each row. That is, when the storage value in a row of the positive value storage circuit is wx, the storage value in the corresponding row of the negative value storage circuit should be 0, and the weight value stored at this time is $w_x-0=w_x$. Similarly, if the storage value in a row of the negative value storage circuit is $w_y$, then the storage value in this corresponding row of the positive value storage circuit should be 0, and the weight value of this row is $0-w_y=-w_y$. Through such a storage mechanism, it is ensured that all the sign bits are 0. The subsequent calculation process is simplified.

FIG. 7 is the structure of the integral calculation circuit provided in the present disclosure. 1 is a positive integral circuit, and 2 is a negative integral circuit. Since the radix-4 booth code is adopted in the present disclosure, the input data has positive and negative values, and the weight values are also stored respectively. Therefore, the control signal 1 (s_np) in FIG. 3 is used to control the input signal of the integral calculation circuit. The positive value integral circuit only receives multiplication results of positives, and the negative value integral circuit only receives multiplication results of negatives. That is, when the control signal 1 (s_np) is high level, the input data encoding circuit outputs negatives, and the positive value integral circuit receives calculation results from the negative value storage circuit, that is, negative input*negative weight=positive result. The negative value integral circuit receives the calculation result from the positive value storage circuit, that is, negative input*positive weight=negative result. When the control signal 1 (s_np) is low level, the input data encoding circuit outputs positive values, and the positive value integral circuit receives the calculation results from the positive value storage circuit, that is, positive input * positive weight=positive result. The negative value integral circuit receives calculation results from the negative value storage circuit, that is, positive input * negative weight=negative result. For n-bits weight values, the first integration capacitors for integration are $C_{n-1}, C_{n-2}, \ldots C_0$, and the relation is: $C_{n-1}=2C_{n-2}=\ldots=2^nC_0$, configured to store the charge represented by the output of the basic units in a column. The second integration capacitors for integration are $C_f$-$C_{n-1}$, $C_f$-$C_{n-2}$... $C_f$-$C_0$, which is used to ensure that when each integrator performs integration, a sum of the integration capacitors is equal to the ADC sampling capacitor ($C_f$). The control MOS reset switch $S_4$ is configured to reset the second integration capacitor ($C_f$-$C_{n-1}$). The integration operation switch $S_2$ is configured to control the operation of the first integration capacitor and the second integration capacitor. The compensation capacitor $C_p$ is configured to ensure a sum of the first integration capacitor $C_{n-1}$ and the compensation capacitor $C_p$ is the same as the sampling capacitor $C_f$. The compensation capacitor reset switch $S_p$ is configured to reset t the compensation capacitor $C_p$, and the charge redistribution switch $S_3$ is configured to equalize a sum of the charge stored in all the first integration capacitors $C_{n-1}$ and the ADC sampling capacitor $C_f$, after data is twice input into the output ends of the basic units in one column. The ADC sampling capacitor $C_f$ is configured to operate to divide charges stored on the first integration capacitor $C_{n-1}$ when the ADC sampling switch Sadc is turned on.

First, the control MOS transistor $S_{1-n-1}$ receives external control to control one of the two selection MOS transistors $Q_{1,n-1}$, $Q_{2,-n-1}$ to turn on, and then control data output from the basic units to output through positive and negative determination process. The positive value storage circuit is turned on when the positive value is output, and the negative value storage circuit is turned on when the negative value is output, and the positive value storage circuit and the negative value storage circuit are turned off when the output is zero.

Second, the integration operation switch $S_2$ is turned on to control data output by the control MOS transistor $S_{1-n-1}$ to be input to the first integration capacitor $C_{n-1}$ and the second integration capacitor ($C_f$-$C_{n-1}$). And the compensation capacitor reset switch $S_p$ is turned on to reset the compensation capacitor $C_p$.

Third, when all of the charge redistribution switches $S_3$ are turned on, charge average distribution is performed. The compensation capacitor $C_p$ and the first integration capacitors $C_{n-1}$ of all the integrators together perform charge redistribution. When dividing the charges, the charges of the first integration capacitors $C_{n-1}$ and the compensation capacitor $C_p$ are equalized to obtain an equivalent voltage.

Finally, the ADC sampling switch Sadc is turned on, so that the ADC sampling capacitor $C_f$ equalizes the charges stored in all of the first integration capacitors $C_{n-1}$.

In the present disclosure, 8-bits input signal is coded into a 4-bits radix-4 booth code. Each bit of the input data is input into the integral circuit in a certain order, based on multiple input parallel computing and axon priority strategy. The integral computing process shown in FIG. 8 is completed according to the principle of charge redistribution. The input signal is expressed in a digital form $x=A_{n/2-1}A_{n/2-2}\ldots A_0$. For each bit of a binary number $A_i$, the input lines with coding values of 1, −1, 2, and −2 are sequentially gated under control of a time multiplexing circuit. The weight value is expressed in the digital form $w=a_{n-1}a_{n-2}\ldots a_0$, $w=a_{n-1}a_{n-2}\ldots a_0$. Through Ohm's law, results of multiplying the input signal by the weight values may be obtained, and expressed as a current signal. Meanwhile, the current signal is transmitted to the positive integral circuit or the negative integral circuit respectively for integral calculation, according to the positive and negative of the input signal and the weight array, to complete a multiplication and accumulation process of the input data.

The analog voltage converter circuit provided in this disclosure is shown in FIG. 9. After obtaining one result of multiplication and accumulation of the input data through the integral calculation circuit, the analog-to-digital conversion circuit performs charge distribution through timing control after inputting 1, −1, and performs charge distribution again after inputting 2, −2. Thus, a weighting process between different input bits is completed, and positive and negative analog output voltages are obtained. These two analog output voltages are input into the positive and negative input ends of the differential SAR ADC respectively, to obtain the digital multiplication and accumulation output and to further form a completed neuromorphic calculation circuit.

In the present disclosure, the input data is input at the same time starting from the lowest bit, multiplied by the weights, and then input into the integration circuit for integration, and after the integration is completed, the next bit is input. That is, $A_{0,0}A_{1,0}\ldots A_{p-1,0}$ are input at the same time, when Ai=1, the input voltage is VA, when Ai=0, the input voltage is 0.

During the integration process, the switches $S_1$ and $S_2$ are turned on, and the switch $S_3$ is turned off to separate the integrators. The output voltage $V_o$ of the integration circuit is:

$$Vo = V_o^- - \frac{V_A \sum_{i=0}^{p-1} A_i G_i T}{C_f} \quad (7)$$

$V_o^-$ is the output voltage of the integrator in the last state, T is integration time, $G_i$ is conductance of a 1-bit binary weight (1/RH is in the high resistance state, 1/RL is in the low resistance state), and $C_f$ is the sum of all integration capacitors. After the integration process is over, switch $S_1$ is turned off to reduce energy loss of the memory circuit, $S_2$ is turned off to ensure that the charge value of the integration capacitor $C_i$ remains unchanged, and $S_3$ is turned on to obtain the equivalent voltage of $y_j = \Sigma 2^{n-1} a_{i,n-1} b_{i,j} + \ldots + \Sigma 2^1 a_{i,1} b_{i,j} + \Sigma 2^0 a_{i,0} b_{i,j}$. Since the relation between the integral capacitances is $C_{n-1} = 2C_{n-2} = \ldots = 2^{n-1}C_0$, when $S_3$ is turned on, the charge amount of capacitance is redistributed according to the capacitance value, and the equivalent analog voltage is obtained.

When the input data is a plurality of bits, after the 1-bit of the input data is completed, the input data moves to the next bit. At this time, the equivalent analog voltage is to be weighted, as shown in FIG. 9. During the entire integration process, the ADC sampling switch is turned on. When $S_3$ is turned on, the previous $V_{out}$ and $V_s$ are added and equalized, that is, $V_{out} = \frac{1}{2}(V_{out}^- + V_s)$, $V_{out}^-$ is the output voltage before $S_3$ is turned on, that is, the equivalent analog voltage after all the previous bits are input.

The analog voltage conversion circuit provided in the present disclosure is shown in FIG. 9. In the present disclosure, the radix-4 booth code is adopted, and system of numeration of different bits is 4, and the input signal may be 1/−1 or 2/−2. In order to simplify the hardware structure, the weighting between different bits is realized by controlling the timing.

(1) When the input signal is 1, the positive and negative integration circuits perform integration separately and maintain the integrated voltage. When the input signal is −1, the positive and negative integration circuits exchange inputs and perform integration again. After two integration operations, $S_3$ is turned on for a charge equalization. At this time, the output voltage is $V_{out,1} = \frac{1}{2}(V_{out}^- + V_{S1})$, $V_{out}^-$ represents an output voltage before switch $S_3$ is turned on, $V_{s1}$ represents a voltage of the switches $S_3$ coupled to the first integration capacitors after inputting 1 and −1 for calculation, and $V_{out,1}$ represents a weighted output voltage between different bits after inputting 1 and −1 for calculation. After the charge equalization is completed, $S_3$ is turned off, $S_2$ and $S_4$ are turned on to complete resetting of the first integration capacitors and the second integrating capacitors.

(2) When the input signal is 2, the positive and negative integration circuits respectively perform integration and maintain the integrated voltage. When the input signal is −2, the positive and negative integration circuits exchange inputs and perform integration again. After two integration operations, the charge equalization is performed again at the previous integration voltage. At this time, the output voltage is $V_{out} = \frac{1}{2}(V_{out,1} + V_{s2}) = \frac{1}{2}[\frac{1}{2}(V_{out}^- + V_{s1}) + V_{s2}]$, $V_{out}$ represents an output voltage after the input calculation of the 1-bit radix-4 booth code is completed, and $V_{s2}$ represents a voltage of the switch $S_3$ coupled to the first integration capacitor after inputting 2 and −2 for calculation.

(3) After the two charge equalization processes are completed, the input encoding circuit outputs the next radix-4 booth code result, and the multiplication and accumulation of the next input bit is executed.

Therefore, the final equivalent analog voltage is $$V_{out} = 4^{-\frac{m}{2}} V_{s,0} + 4^{-\frac{m}{2}-1} V_{s,1} + \ldots + 4^{-1} V_{s,\frac{m}{2}-1} \quad (9)$$

$V_{s,0}$ and $V_{s,1}$ are calculated according to the following formula:

$$V_{s,i} = V_{s1,i} + 2V_{s2,i} \quad (10)$$

$V_{s,i}$ represents the output voltage of the integration circuit when the $i^{th}$ code value of the radix-4 booth code is input, $V_{s1,i}$ represents the output voltage of the integration circuit after the integration circuit complete calculation of the input voltage of 1 and −1 when the $i^{th}$ code value of the radix-4 booth code is input, $V_{s2,i}$ represents the output voltage of the integration circuit after the integration circuit complete calculation of the input voltage of 2 and −2 when the $i^{th}$ code value of the radix-4 booth code is input, and m represents a length of the radix-4 booth code.

The two positive and negative equivalent analog voltages are subtracted to obtain the final analog voltage output.

Through the above integration process and charge redistribution process, the multiplication and accumulation operation of the digital radix-4 booth code inputting and the weight of the differential storage is completed, and the output voltage in the analog form is obtained. For subsequent calculations, the two voltages are differentially input to the ADC for A-D conversion.

The above specific embodiments do not constitute a limitation on the protection scope of the present disclosure. Those skilled in the art should understand that various modifications, combinations, sub-combinations and substitutions can be made according to design requirements and other factors. Any modification, equivalent replacement and improvement made within the spirit and principle of this application shall be included in the protection scope of this application.

What is claimed is:

1. A multiplication and accumulation circuit based on radix-4 booth code and differential weight storage, comprising: an input data encoding circuit, a differential weight storage circuit, an integral calculation circuit and a differential analog-to-digital converters (ADC) circuit, wherein output of the input data encoding circuit is sent into the differential ADC circuit after sequentially passing through the differential weight storage circuit, wherein:
the input data encoding circuit is configured to encode original input data;
the differential weight storage circuit is configured to store weight values, and multiply the original input data after being encoded by the weight values stored to obtain multiplication results;
the integral calculation circuit is configured to respectively accumulate positive values and negative values of respective multiplication results; and
the differential ADC circuit is configured to perform analog-to-digital conversion on a difference between accumulated positive values and accumulated negative values to obtain a digital multiplication and accumulation result;
wherein the differential weight storage circuit comprises two weight storage circuits with equal size, each of the weight storage circuits comprises a plurality of basic units, each of the basic units comprises a transistor and a binary resistive random-access- memory (RRAM) coupled in series, one end of the binary RRAM is coupled to a source of the transistor, the other end of the binary RRAM is grounded; a gate of the transistor is coupled to an output end of the input data encoding circuit, and a drain of the transistor is configured as an output end of the basic unit and coupled to an input end of the integral calculation circuit, the drains of the transistors of the basic units in the same column are coupled to each other, and the gates of the transistors of the basic units in the same row are coupled to each other and configured as an input end of the basic unit.

2. The circuit according to claim 1, wherein the input data encoding circuit comprises a memory, an encoder and a multiplexer (mux) coupled in sequence;
the memory is configured to pre-store the original input data, and output data according to a timing sequence;
the encoder is configured to receive the data, and encode the received data based on the radix-4 booth code to obtain an encoding result; and
the mux is configured to gate different output channels and output encoded values according to the encoding result.

3. The circuit according to claim 1, wherein the two weight storage circuits comprise a positive value storage circuit and a negative value storage circuit, the positive value storage circuit stores positive weight values, and the negative value storage circuit stores negative weight values.

4. The circuit according to claim 3, wherein the integral calculation circuit comprises a series of integral sub-circuits and a compensation circuit; and
each integral sub-circuit comprises a selection switch group and an integrator.

5. The circuit according to claim 4, wherein each selection switch group comprises three transistors comprising two selection transistors $Q_{1,n-1}$, $Q_{2,n-1}$ and a control transistor $S_{1,n-1}$; and
sources of the two selection transistors are configured as the input ends of the integral calculation circuit, and are respectively coupled to output ends of the basic units in one column of the positive value storage circuit and output ends of the basic units in one column of the negative value storage circuit, drains of the two selection transistors are coupled to a source of the control transistor, a gate of the control transistor is coupled to an external control switch circuit, and a drain of the control transistor is configured as an output end of the integral calculation circuit and coupled to the differential ADC circuit.

6. The circuit according to claim 4, wherein each integrator comprises a first integration capacitor, a second integration capacitor, a reset switch $S_4$, and an integration operation switch $S_2$; and
the first integration capacitor, the second integration capacitor, and the reset switch $S_4$ are coupled in parallel between a voltage end Vdd and an output end of the integral sub-circuit, the integration operation switch $S_2$ is coupled in series between the first integration capacitor and the second integration capacitor, a lead-out between the first integration capacitor and the integration operation switch $S_2$ is coupled to an ADC sampling line through a charge redistribution switch $S_3$.

7. The circuit according to claim 6, wherein the compensation circuit comprises a compensation capacitor $C_p$ and a compensation capacitor reset switch $S_p$; and
the compensation capacitor $C_p$ and the compensation capacitor reset switch $S_p$ are coupled in parallel between the voltage end Vdd and the ADC sampling line.

8. The circuit according to claim 7, wherein the differential ADC circuit comprises a first charge redistribution switch, a second charge redistribution switch, an ADC sampling capacitor $C_f$ and an ADC sampling switch $S_{adc}$, and
the first charge redistribution switch is arranged between the compensation capacitor $C_p$ and the compensation capacitor reset switch $S_p$ coupled in parallel and the ADC sampling line; the second charge redistribution switch $S_3$ is arranged between the ADC sampling line and each first integration capacitor; and the ADC sampling capacitor $C_f$ and the ADC sampling switch $S_{adc}$ coupled in series are coupled between the voltage end Vdd and the output end of the integral sub-circuit.

9. The circuit according to claim 3, wherein each of the weight storage circuits comprises an array of a plurality of basic units arranged and coupled, each of the basic units is composed of a transistor and a binary resistive random-access-memory (RRAM) coupled to each other; and
the basic units in the same column are coupled in series, and the basic units in the same row are coupled in series.

10. The circuit according to claim 9, wherein the basic units in each row of the weight storage circuit store one weight value together.

11. The circuit according to claim 9, wherein each basic unit of the weight storage circuit stores one bit of weight.

12. The circuit according to claim 3, wherein the basic units in each row are configured to receive the encoded value processed by the input data encoding circuit and multiply the encoded value by each bit of weight in the corresponding row of the positive value storage circuit or the negative value storage circuit to obtain multiplication results, wherein a multiplication and accumulation result of a current bit is obtained by adding the multiplication results by column.

13. The circuit according to claim 1, wherein the original input data is binary code data.

14. The circuit according to claim 1, wherein the input data encoding circuit is configured to obtain every three bits of data sequentially, starting from three lowest bits of the original input data, every three bits of data having one bit overlapped.

15. The circuit according to claim 14, wherein the mux is a 4-to-1 mux,
- the memory is configured to output three lowest bits of current data each time;
- the encoder is configured to receive the three lowest bits of data and to encode the three lowest bits of data into the radix-4 booth code to generate the encoding result; and
- the 4-to-1 mux is configured to gate different four output channels and output four different code values of the radix-4 booth code in sequence within 4 clock cycles, wherein one code value of the radix-4 booth code is output each clock cycle, and the four different code values of the radix-4 booth code are output within 4 clock cycles.

* * * * *